United States Patent
Amano

(10) Patent No.: US 9,931,670 B2
(45) Date of Patent: Apr. 3, 2018

(54) INTEGRATED ULTRASOUND TRANSDUCER

(71) Applicant: Konica Minolta Laboratory U.S.A., Inc., San Mateo, CA (US)

(72) Inventor: Jun Amano, Hillsborough, CA (US)

(73) Assignee: Konica Minolta Laboratory U.S.A., Inc., San Mateo, CA (US)

( * ) Notice: Subject to any disclaimer, the term of this patent is extended or adjusted under 35 U.S.C. 154(b) by 455 days.

(21) Appl. No.: 14/701,242

(22) Filed: Apr. 30, 2015

(65) Prior Publication Data

US 2015/0336132 A1 Nov. 26, 2015

Related U.S. Application Data

(60) Provisional application No. 62/002,259, filed on May 23, 2014.

(51) Int. Cl.
| | |
|---|---|
| *H01L 41/107* | (2006.01) |
| *B06B 1/02* | (2006.01) |
| *H01L 29/786* | (2006.01) |
| *B06B 1/06* | (2006.01) |
| *H01L 29/49* | (2006.01) |

(52) U.S. Cl.
CPC .......... *B06B 1/0207* (2013.01); *B06B 1/0622* (2013.01); *H01L 29/4908* (2013.01); *H01L 29/78603* (2013.01); *H01L 29/78648* (2013.01); *H01L 29/78651* (2013.01); *H01L 29/78684* (2013.01); *B06B 2201/55* (2013.01)

(58) Field of Classification Search
CPC . B06B 1/0207; B06B 1/0622; H01L 29/4908; H01L 29/78603; H01L 29/78648; H01L 29/78651; H01L 29/78684
USPC .................................................. 310/317–319
See application file for complete search history.

(56) References Cited

U.S. PATENT DOCUMENTS

| | | | | |
|---|---|---|---|---|
| 7,136,215 | B1* | 11/2006 | Machida | G02B 26/0858 204/192.34 |
| 2013/0063530 | A1* | 3/2013 | Higashino | B41J 2/14233 347/71 |
| 2014/0064904 | A1* | 3/2014 | Bibl | B81C 1/0015 414/751.1 |
| 2014/0267509 | A1* | 9/2014 | Shinkai | B41J 2/14233 347/70 |
| 2015/0054387 | A1* | 2/2015 | Li | H01L 41/0471 310/363 |
| 2015/0165479 | A1* | 6/2015 | Lasiter | B06B 1/0666 310/322 |

\* cited by examiner

*Primary Examiner* — Thomas Dougherty
(74) *Attorney, Agent, or Firm* — Osha Liang LLP

(57) ABSTRACT

An ultrasonic transmitter includes a piezoelectric integrated thin film transistor (PITFT). The transistor includes a top gate electrode, a bottom gate electrode, and a piezoelectric layer. The piezoelectric layer generates vibrations in response to a voltage applied across the top gate electrode and the bottom gate electrode. The transistor includes micro-electrical-mechanical systems (MEMS) mechanically coupled to the PITFT. The MEMS includes a resonator that transmits ultrasonic pressure waves based on the vibrations.

12 Claims, 10 Drawing Sheets

INTEGRATED ULTRASOUND TRANSDUCER

BACKGROUND

Pressure waves are commonly used in a diverse array of applications and may be acoustic if in the range of human hearing, infrasound if below the range of human hearing, or ultrasound if above the range of human hearing. Ultrasound, also referred to as ultrasonic, is of particular importance due to its short wavelength which is required for many sensing and imaging applications. Ultrasound imaging, commonly referred to as ultrasonic imaging, is used in both veterinary medicine and human medicine as a non-invasive diagnostic tool. Medical sonography is the real time generation of visual images from information captured by an ultrasonic imaging method.

The process of ultrasonic imaging is based on the controlled generation, transmission, and reception of ultrasound pressure waves. Devices that convert electrical signals to ultrasound pressure waves or ultrasound pressure waves to electrical signals are commonly called ultrasound transducers. An ultrasonic transmitter is required to generate and transmit ultrasound pressure waves while an ultrasonic receiver is required to receive the ultrasound pressure waves. A combined ultrasonic transmitter and ultrasonic receiver is called an ultrasonic transceiver. In some applications an ultrasonic transceiver is used while in others both an ultrasonic transmitter and ultrasonic receiver are used. In some cases, the magnitude of received and transmitted ultrasonic waves may be differ substantially, e.g. by a factor of 100.

Ultrasonic imaging quality depends directly on the characteristics of the ultrasonic devices used to perform the imaging process. Improvement of the characteristics of ultrasonic devices may improve the quality of ultrasonic imaging processes.

BRIEF DESCRIPTION OF DRAWINGS

Certain embodiments of the disclosure will hereafter be described with reference to the accompanying drawings. It should be understood, however, that the accompanying drawings illustrate only the various implementations described herein and are not meant to limit the scope of various technologies described herein. The drawings show and describe various embodiments of the current disclosure.

DETAILED DESCRIPTION

Specific embodiments will now be described in detail with reference to the accompanying figures. In the following description, numerous details are set forth to provide an understanding of the present disclosure. However, it will be understood by those skilled in the art that the embodiments of the present disclosure may be practiced without these details and that numerous variations or modifications from the described embodiments may be possible.

Figure 1:
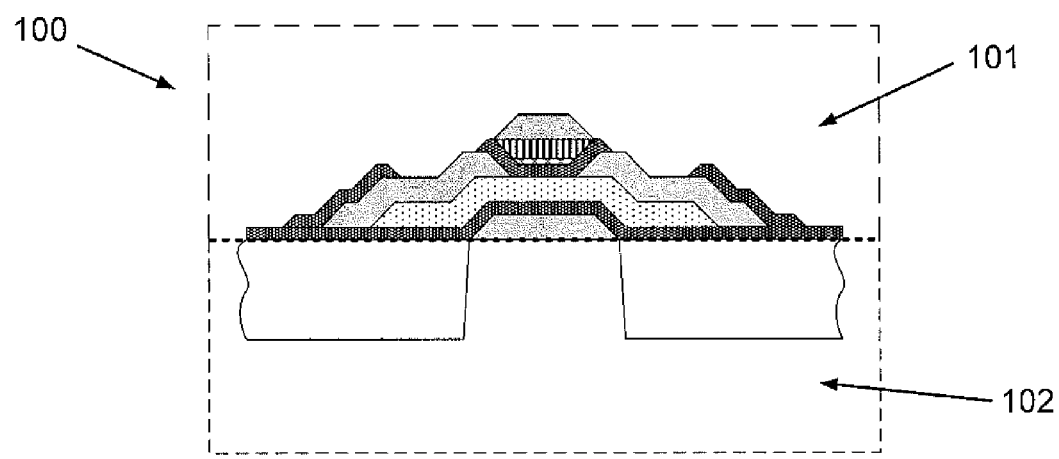
FIG. 1 shows an ultrasonic transceiver device in accordance with one or more embodiments.

FIG. 1 shows a device (100) in accordance with one or more embodiments. More specifically, FIG. 1 shows an ultrasonic transceiver (100). The ultrasonic transceiver (100) includes a piezoelectric integrated thin film transistor (PITFT) (101) and micro-electrical-mechanical systems (MEMS) (102). The PITFT (101) and MEMS (102) are mechanically coupled. Mechanical coupling allows vibrations to be transmitted between the PITFT (101) and MEMS (102). For example, if mechanical vibrations are generated in the PITFT (101), the vibrations are transmitted to the MEMS (102). Similarly, if vibrations are generated in the MEMS (102), the vibrations are transmitted to the PITFT (101). In FIG. 1, the mechanical coupling is the arrangement of the PITFT (101) being disposed on the MEMS structure (102). However, this arrangement is merely an example and should not be viewed as construing the scope of the invention. Embodiments include any arrangement that mechanically couples the PITFT (101) and MEMS (102). For example, a layer of material placed between the PITFT (101) and the MEMS (102) that physically separates but still transmits vibrations between the PITFT (101) and the MEMS structure (102) is also a mechanical coupling.

Figure 2:
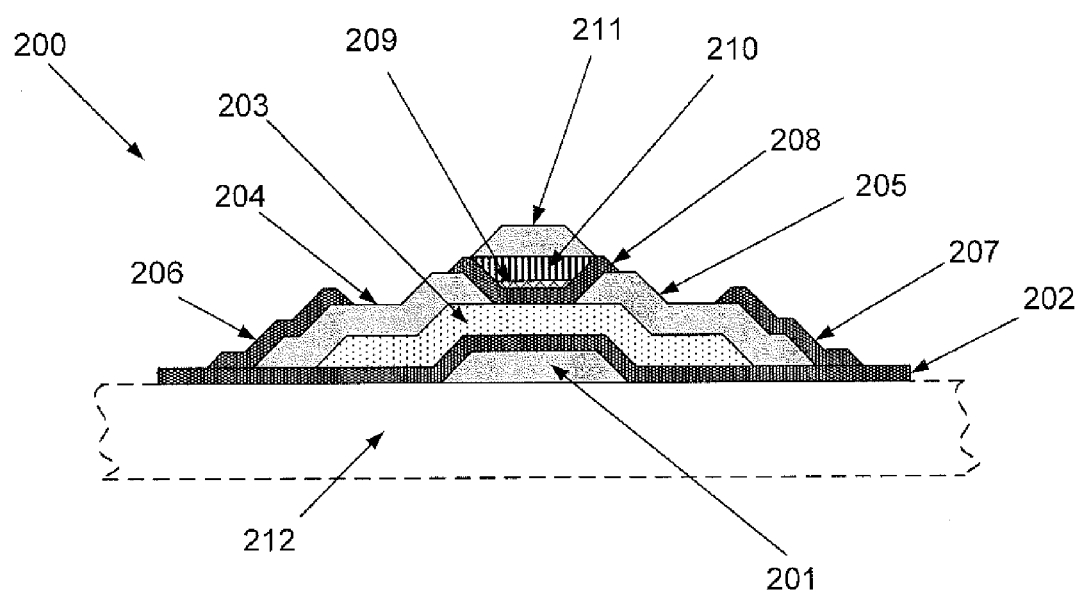
FIG. 2 shows a piezoelectric integrated thin film transistor (PITFT) in accordance with one or more embodiments.

In accordance with one or more embodiments, FIG. 2 shows a detailed illustration of the PITFT (200). For purposes of illustration to aide in understanding of the embodiments, the PITFT has been drawn on a surface (212) with dashed side walls to indicate the arbitrary shape and size of the surface (212). The surface (212) is not part of the PITFT (200) and exists merely to aide in understanding the PITFT (200). The PITFT (200) includes a bottom gate electrode (201). In one or more embodiments, the bottom gate electrode (201) material is a conductive material, e.g. copper, gold, nickel, etc. In one or more embodiments, the bottom gate electrode (201) thickness is between 50 nm and 500 nm. Thickness is oriented vertically in FIG. 2. In one or more embodiments, the cross section of the bottom gate electrode (201) is between 100 nm×100 nm and 2000 nm×2000 nm. In FIG. 2 the cross section is the combination of width, oriented horizontally in FIG. 2, and depth, oriented into or out of FIG. 2. Stating the cross section is between 100 nm×100 nm and 2000 nm×2000 nm should be interpreted as the width is between 100 nm and 2000 nm and the depth is between 100 nm and 2000 nm. The width is not required to equal the depth. References to a cross section of any element described in later sections of this application should be interpreted similarly.

The PITFT (200) further includes a bottom gate oxide layer (202) disposed on the bottom gate electrode (201). The bottom gate oxide layer (202) electrically insulates the bottom gate electrode (201) from other layers. The bottom gate oxide layer (202) extends in width and depth beyond the cross section of the bottom gate electrode (201) to the extent necessary to electrically insulate the bottom gate electrode (201). In one or more embodiments, the bottom gate oxide layer (103) thickness is between 10 nm and 100 nm.

The PITFT (200) further includes a semiconductor layer (203) disposed on the bottom gate oxide layer (202). In one or more embodiments, the semiconductor layer (203) material may be silicon, silicon-germanium alloys, and III-V compound semiconductors. The semiconductor layer (203) has approximately the same depth as the bottom gate electrode (201) but has a width that extends beyond each edge of the bottom gate electrode (201) to enable the formation of a source or drain for a transistor. The centroid of the semiconductor layer (203) is separated from the centroid of the bottom gate electrode (201) by the thickness of the bottom gate oxide layer (202) but is otherwise aligned. In one or more embodiments, the bottom gate oxide layer (103) thickness is between 10 nm and 100 nm.

The PITFT (200) further includes a source electrode (204) and a drain electrode (205) that are disposed on each end of the semiconducting layer (203), which extend beyond the width of the bottom gate electrode (201), respectively. In one or more embodiments, the source electrode (204) and drain electrode (205) material is a conductive material, e.g. copper, gold, nickel, etc. The source electrode (204) and drain electrode (205) depths may be the same as the semiconductor layer (203) depth. The source electrode (204) and drain electrode (205) widths may be equal to the width of each end of the semiconductor layer (203) that extends beyond the bottom gate electrode (201). In one or more embodiments, the source electrode (204) and drain electrode (205) thickness is between 50 nm and 500 nm.

The PITFT (200) further includes a source isolation layer (206) and drain isolation layer (207) that are disposed the side opposite of the bottom gate electrode (201) on each of the drain electrode (204) and source electrode (205) respectively. The source isolation layer (206) and drain isolation layer (207) electrically insulate the drain electrode (204) and source electrode (205) from other layers and the ambient environment. In one or more embodiments, the source isolation layer (206) and drain isolation layer (207) thicknesses are between 10 nm and 100 nm.

The PITFT (200) further includes a top gate oxide layer (208) disposed on the semiconductor layer (203). The top gate oxide layer (208) electrically insulates the semiconductor layer (203) from other layers. The top gate oxide layer (208) may have approximately the same cross section as the bottom gate electrode (201). The centroid of the top gate oxide layer (208) is separated from the centroid of the bottom gate electrode (201) by the combined thickness of the bottom gate oxide layer (202) and semiconductor layer (203) but is otherwise aligned (or approximately aligned). In one or more embodiments, the top gate oxide layer (208) thickness is between 10 nm and 100 nm.

The PITFT (200) further may include an intermediate oxide layer (209) disposed on the top gate oxide layer (208). The intermediate oxide layer (209) directs the orientation of the piezoelectric layer (210) disposed on the intermediate oxide layer (209), which may enhance the properties of the piezoelectric layer (210) (discussed below). The cross section of the intermediate oxide layer (209) is equal to or less than the cross section of the bottom gate electrode (209). The centroid of the intermediate oxide layer (209) is separated from the centroid of the bottom gate electrode (201) by the combined thickness of the bottom gate oxide layer (201), semiconductor layer (203), and top gate oxide layer (208) but is otherwise aligned (or approximately aligned). In one or more embodiments, the intermediate oxide layer (104) material is SrRuO2. In one or more embodiments, the intermediate oxide layer (209) thickness is between 50 nm and 150 nm. In some embodiments, the intermediate oxide layer (209) might not be present (i.e., the intermediate oxide layer (209) is optional).

The PITFT (200) further includes the piezoelectric layer (210) disposed on the intermediate oxide layer (209). If the intermediate oxide layer (209) is not present, the piezoelectric layer (210) is disposed on the top gate oxide layer (208).

If an intermediate oxide layer (209) is present, the microstructure of the piezoelectric layer (210) will be oriented in accordance with the intermediate oxide layer (209) which enhances the characteristics of the piezoelectric layer (210). In one or more embodiments, the piezoelectric layer (210) material is a high piezoelectric coefficient material. In one or more embodiments, the high piezoelectric coefficient material may be lead zirconium titanate, lead magnesium niobate, lead magnesium niobate lanthanum, and lead nickel niobate. The centroid of the piezoelectric layer (210) is separated from the centroid of the bottom gate electrode (201) by the combined thickness of the bottom gate oxide layer (202), semiconducting layer (203), top gate oxide layer (208), and intermediate oxide layer (209), if present, but is otherwise aligned (or approximately aligned). The cross section of the piezoelectric layer (210) is equal to or less than the cross section of the bottom gate electrode (201). In one or more embodiments, the piezoelectric layer (210) thickness is between 100 nm and 2000 nm.

The PITFT (200) further includes a top gate electrode (211) disposed on the piezoelectric layer (210). In one or more embodiments, the top gate electrode (211) material is a conductive material, e.g. copper, gold, nickel, etc. In one or more embodiments, the top gate electrode (211) cross section is equal to or less than the bottom gate electrode (201) cross section. The centroid of the top gate electrode (211) is separated from the centroid of the bottom gate electrode (201) by the combined thickness of the bottom gate oxide layer (202), semiconducting layer (203), top gate oxide layer (208), piezoelectric layer (210), and intermediate oxide layer (209), if present, but is otherwise aligned (or approximately aligned). In one or more embodiments, the top gate electrode (211) thickness is between 50 nm and 500 nm.

Figure 3:
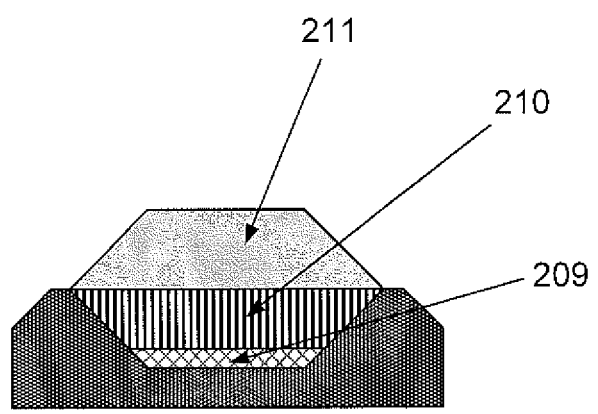
FIG. 3 shows an enlarged view of a PITFT in accordance with one or more embodiments.

FIG. 3 shows an enlarged view of the PITFT (200) in accordance with one or more embodiments. More specifically, FIG. 3 shows an enlarged view of the intermediate oxide layer (209), piezoelectric layer (210), and top gate electrode (211) to more clearly illustrate the location of the intermediate oxide layer (209).

Figure 4:
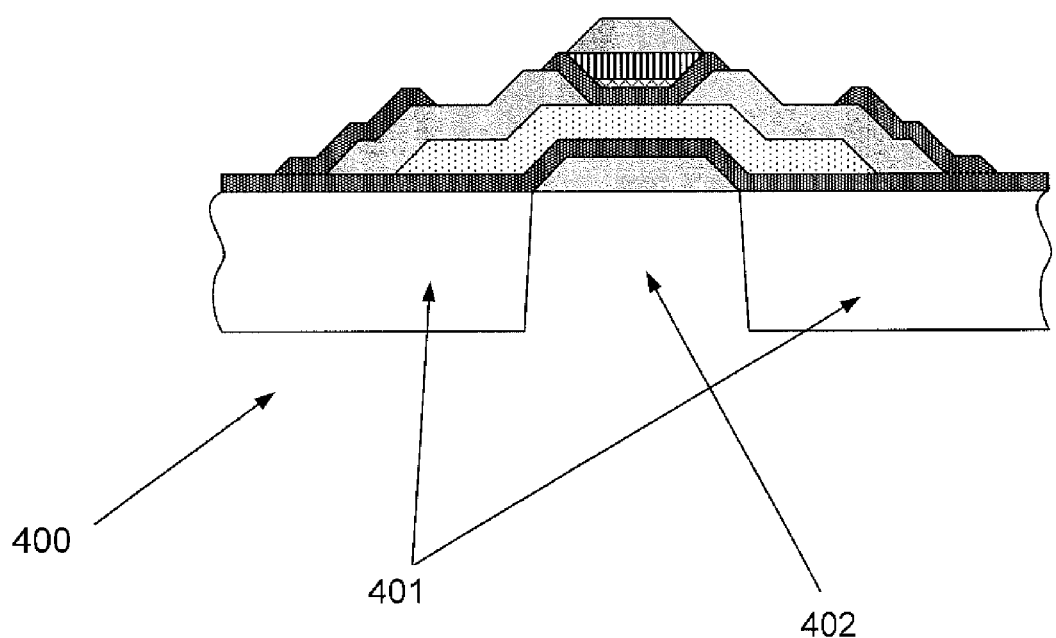
FIG. 4 shows micro-electrical-mechanical systems (MEMS) in accordance with one or more embodiments.

FIG. 4 shows a MEMS (400) in accordance with one or more embodiments of the invention. The MEMS (400) includes a substrate (401). In one or more embodiments, the substrate (401) material may be a hard material, e.g. glass, silicon, or ceramic. In one or more embodiments, the substrate (401) material may be a soft material, e.g. polyimide film, Teflon, or other polymer. In one or more embodiment, the thickness of the substrate may be between 0.2 mm and 1 mm. The curved lines along the edges of the substrate (401) in FIG. 4 indicate that the substrate may be wider than drawn but is at least equal to the width of the PITFT (101).

The MEMS (400) further includes a resonator (402). In FIG. 4, the resonator is a cavity in the substrate (100). In one or more embodiments, the cross section of the resonator is equal to or less than the cross section of the bottom gate electrode (201). The resonator (402) is disposed on the bottom gate electrode (201). The resonator (402) may be the same thickness as the substrate (101).

Figure 5:
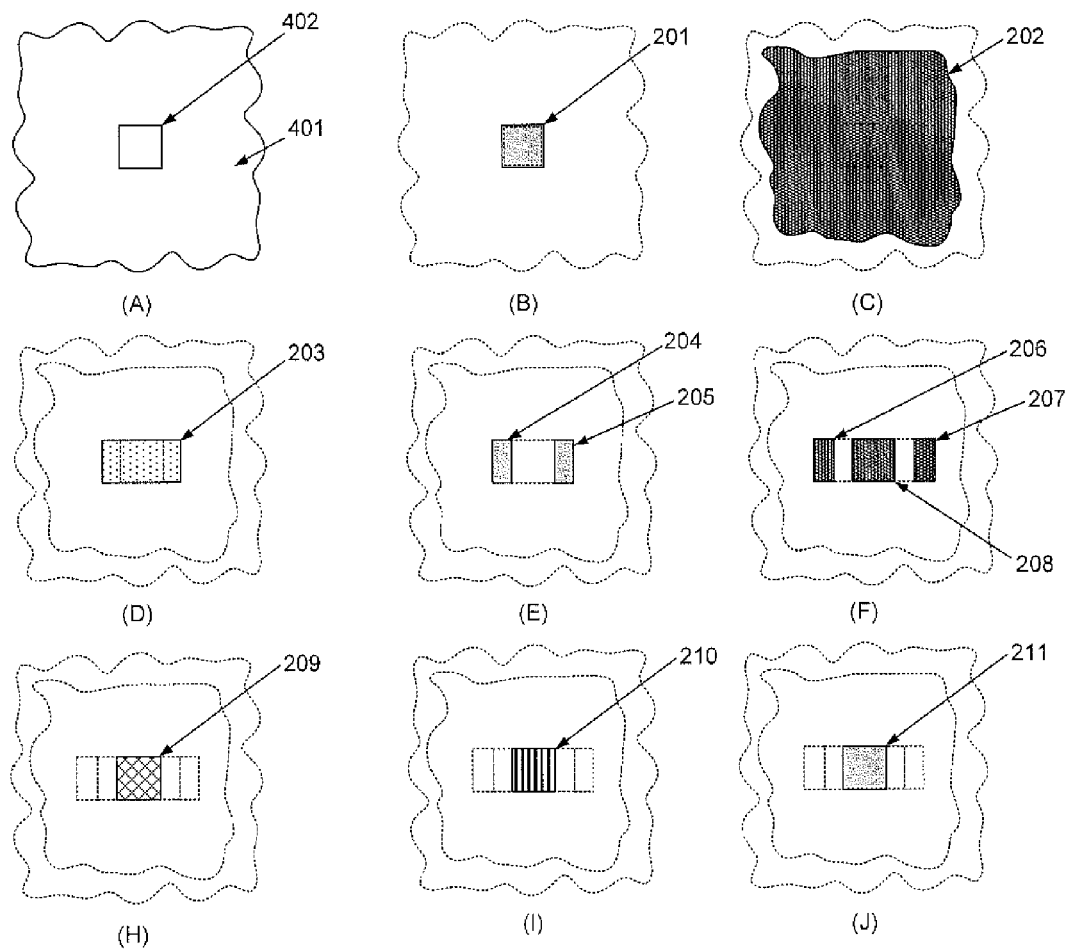
FIG. 5 shows an ultrasonic transceiver device in accordance with one or more embodiments.

FIG. 5 shows a series of panels (A-J) depicting an ultrasonic transceiver device (100) in accordance with one or more embodiments. Specifically, panels A-J show a layer by layer view of the device (100). In each view, the elements of the device on that layer are indicated by a solid outline and a fill color. Previously described layers are shown with a dashed outline and are unfilled to better illustrate the location of each element. The layer by layer view starts with the substrate (401) and resonator (402) in panel A. The curved outer boundary of the substrate (401) indicates that its specific outer boundary may vary in shape and size. Panel B shows the bottom gate electrode (201). Panel C shows the bottom gate oxide layer (202). Panel D shows the semiconducting layer (203). Panel E shows the source electrode (204) and drain electrode (205). Panel F shows the source isolation (206), drain isolation (207), and top gate oxide layer (208). Panel H shows the intermediate oxide layer (209) that may or may not be present. Panel I shows the piezoelectric layer (210). Panel J shows the top gate electrode (211).

Figure 6:
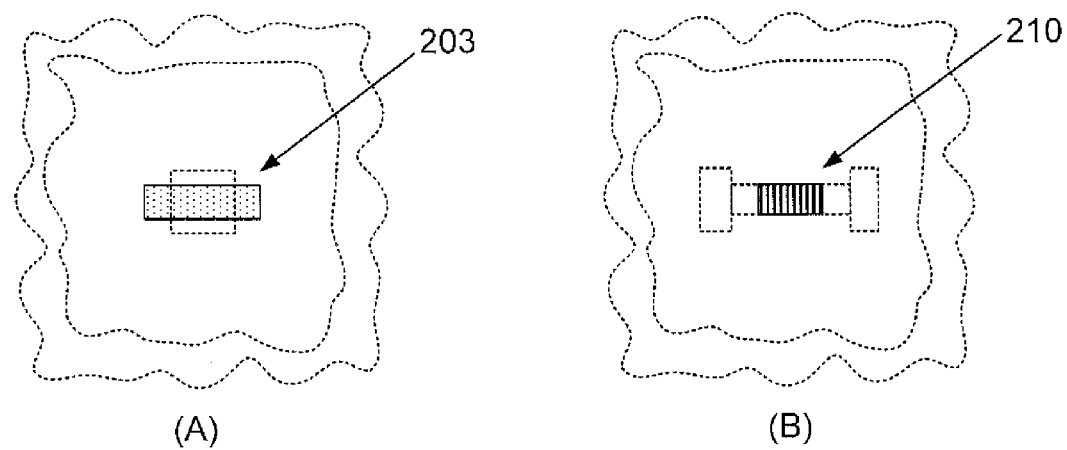
FIG. 6 shows an ultrasonic transceiver device in accordance with one or more embodiments.

FIG. 6 shows two panels depicting the device (100) in accordance with one or more embodiments. Specifically, FIG. 6 shows a layer view illustrating potential cross sections of the semiconductor layer (203) and piezoelectric layer (210). Panel A in FIG. 6 shows a semiconductor layer (203) with a narrower cross section than as illustrated in Panel D in FIG. 5. Similarly, panel B in FIG. 6 shows a piezoelectric layer (210) with a narrower cross section than as illustrated in panel I of FIG. 5.

In one or more embodiments of the invention, the resonator (402) is fabricated by an etching process. As part of the etching process, an etching mask is applied to the substrate (401). The etching mask prevents any part of the substrate covered by the etching mask from being chemically etched during the etching process. A hole in the etching mask allows a section of the substrate (401) to be chemically etched. The location and cross section of the hole in the etching mask correspond to the location and the cross section of the resonator (402). Once the etching mask is applied, the substrate (401) is exposed to etching chemicals which cause the unmasked area of the substrate (401) to be removed. The bottom gate electrode (201) is used as a backstop for the etching process. In other words, the etching process is complete when the etching chemicals reach the backstop. Because the backstop exists, there is less need to focus on the length of time that the etching chemicals are in contact with the substrate. Using the bottom gate electrode (201) as a backstop, also referred to as an etch stop layer, also increases the precision of the resonator (402) thickness and eliminates the necessity for difficult etching processes such as time based etching, e.g. attempting to create a desired feature by etching for a fixed period of time without a backstop. In one or more embodiments, the PITFT (201) is fabricated by a lithographic process on the substrate (401).

The ultrasonic transceiver (100) can both transmit and receive ultrasonic pressure waves. In other words, the ultrasonic transceiver may operate in a transmit mode or a receiving mode. During the transmit mode, a time varying voltage is applied across the bottom gate electrode (201) and the top gate electrode (211). In one or more embodiments, a time varying voltage of less than 10 volts is applied. In response to the time varying voltage, the piezoelectric layer (210) expands and contracts. The expansion and contraction of the piezoelectric layer (210) results in a plurality of vibrations within the PITFT (101). The resonator (402) of the MEMS (102), which is mechanically coupled to the PITFT (101), converts the plurality of vibrations into ultrasonic pressure waves and transmits these ultrasonic pressure waves into the medium (e.g., air) surrounding the ultrasonic transceiver (100).

During the receiver mode, the resonator (402) converts incoming (i.e., from the surrounding medium) ultrasonic pressure waves into a plurality of vibrations. The amplitude of the incoming ultrasonic pressure waves may be very small. As the PITFT (101) is mechanically coupled to the MEMS (102) having the resonator (402), the plurality of vibrations causes the piezoelectric layer (201) to expand and contract. The expansion and contraction of the piezoelectric layer (201) generates a time varying voltage across the bottom gate electrode (201) and top gate electrode (211). If the amplitude of the incoming ultrasonic pressure waves is small, the voltage generated across the bottom gate electrode (201) and top gate electrode (211) will be very small and may require amplification to a suitable level for measurement. Voltages across the top gate electrode (211) and bottom gate electrode (201) modulate the current in the semiconductor layer (203) and result in an amplified voltage across the source electrode (204) and drain electrode (205). Advantageously, additional amplification circuitry outside of the ultrasonic transceiver (100) is not required to increase the voltage to measurable levels.

Figure 7:
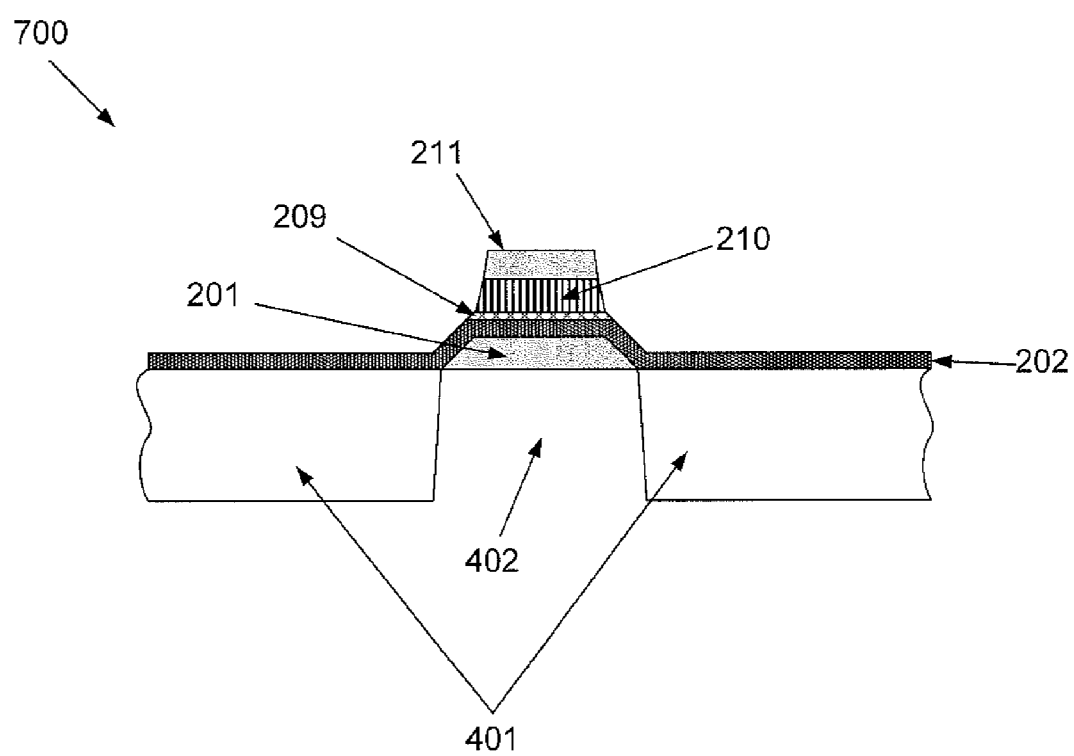
FIG. 7 shows an ultrasonic transmitting device in accordance with one or more embodiments.

In one or more embodiments, only the transmission of ultrasonic pressure waves is required. FIG. 7 shows an ultrasonic transmitter (700) in accordance with one or more embodiments. The ultrasonic transmitter (700) is essentially the ultrasonic transceiver (100) following the removal of the semiconductor layer (203), source electrode (204), drain electrode (205), source isolation (206), drain isolation (207), and top gate oxide layer (208). In one or more embodiments, the top gate oxide layer (208) might not be removed (i.e., the ultrasonic transmitter (700) might include the top gate oxide layer (208)).

In accordance with one or more embodiments, a number of ultrasonic transceivers (100), ultrasonic transmitters (700), or a combination of both may be combined to form an array. The MEMS (102) of each ultrasonic transceiver (100) or ultrasonic transmitter (700) is part of a single substrate (401). Resonators (402) for each MEMS (102) are formed in the substrate (401) and a PITFT (101) is placed in a corresponding location on the substrate (401). Electrical interconnections between each ultrasonic transceiver (100) or transmitter (700) and external circuitry are located on the substrate (401).

Figure 8:
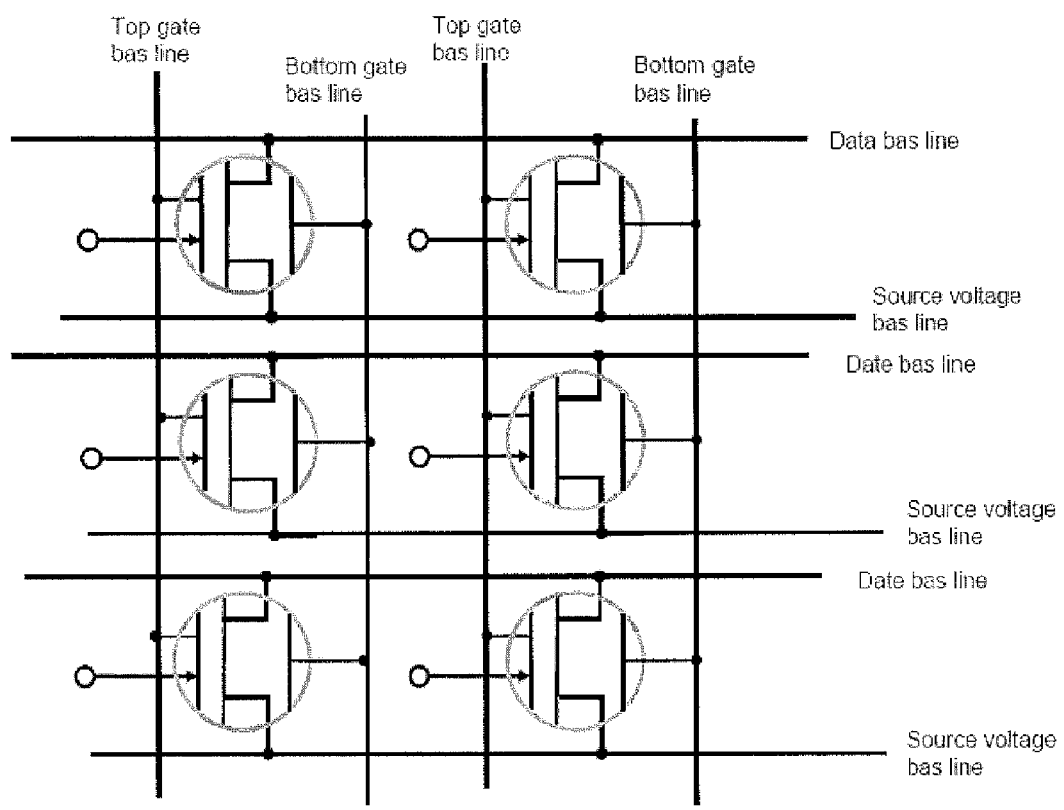
FIG. 8 shows a schematic representation of connections for an array in accordance with one or more embodiments.

In accordance with one or more embodiments, in the array all of the top gate electrodes may be interconnected and connected to an external bias voltage. All of the bottom gate electrodes may be interconnected and connected to an external bias voltage. All of the source electrodes may be interconnected and connected to an external bias voltage. All of the drain electrodes may be interconnected and connected to an external bias voltage that varies in response to a desired transmission. FIG. 8 shows a schematic illustrating the interconnections and external connections.

Figure 9:
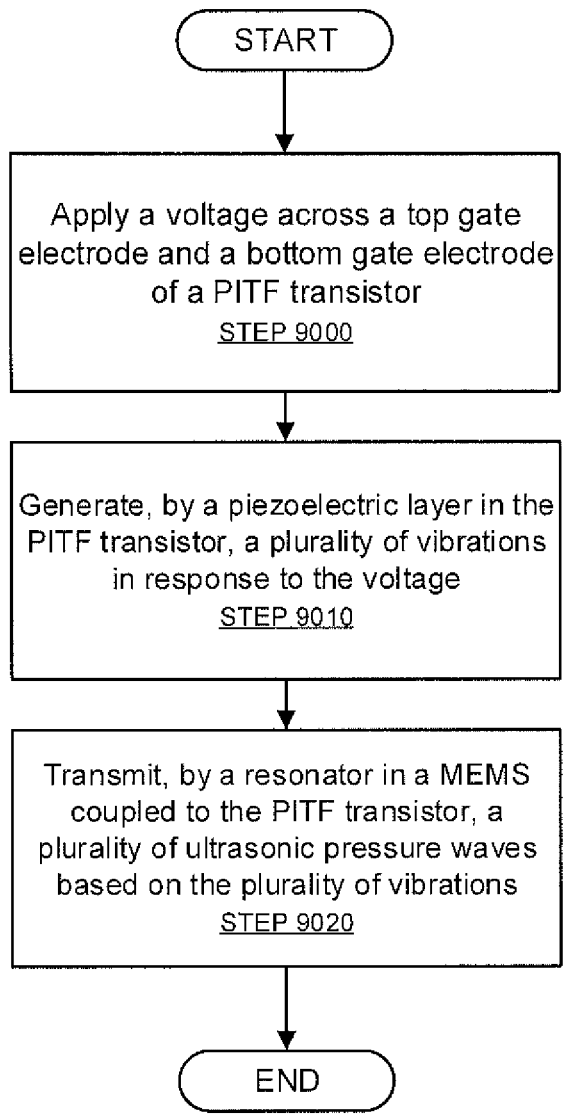
FIG. 9 shows a flowchart in accordance with one or more embodiments of the invention.

FIG. 9 shows a flowchart in accordance with one or more embodiments of the invention. The method depicted in FIG. 9 may be used to operate the ultrasonic transceiver (100) in transmitter mode. One or more steps shown in FIG. 9 may be omitted, repeated, and/or performed in a different order among different embodiments of the invention. Accordingly, embodiments of the invention should not be considered limited to the specific number and arrangement of steps shown in FIG. 9.

Initially, at Step 9000, a voltage is applied across the top gate electrode (211) and bottom gate electrode (201). In Step 9010, the piezoelectric layer (203) generates a plurality of vibrations in response to the voltage. In Step 9020, the resonator (402) generates and then transmits a plurality of ultrasonic pressure waves based on the plurality of vibrations.

Figure 10:
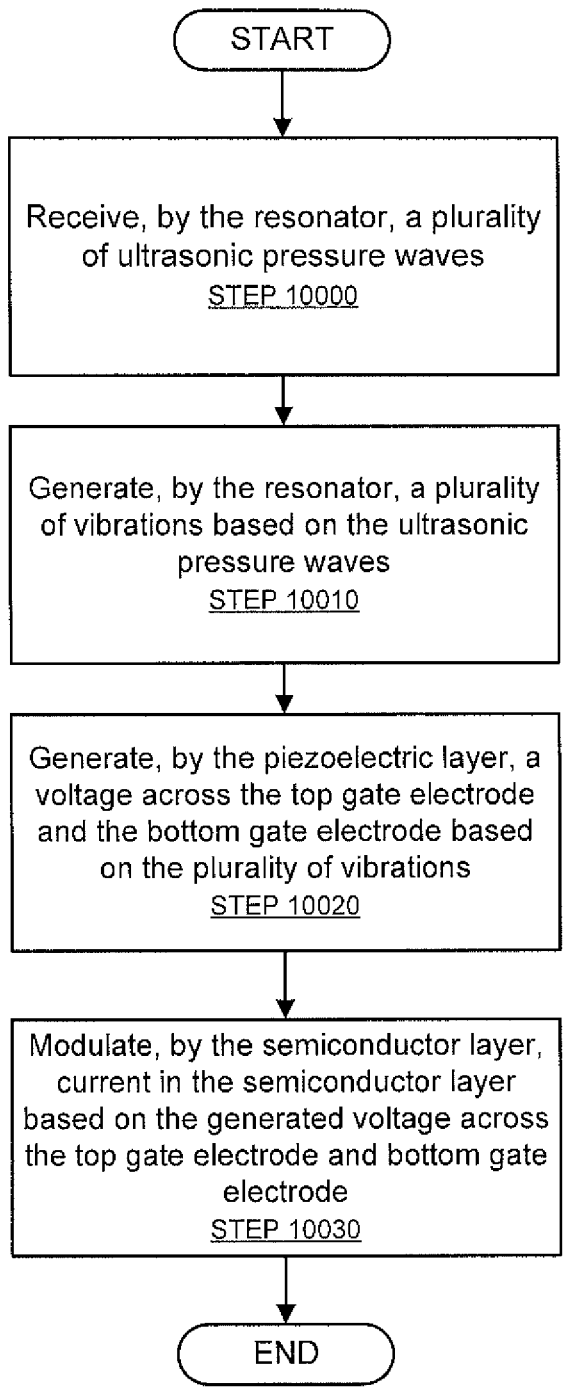
FIG. 10 shows a flowchart in accordance with one or more embodiments of the invention.

FIG. 10 shows a flowchart in accordance with one or more embodiments of the invention. The method depicted in FIG. 10 may be used to operate the ultrasonic transceiver (100) in receiver mode. One or more steps shown in FIG. 10 may be omitted, repeated, and/or performed in a different order among different embodiments of the invention. Accordingly, embodiments of the invention should not be considered limited to the specific number and arrangement of steps shown in FIG. 10.

Initially, in Step 10000, a plurality of ultrasonic pressure waves are received by the resonator (402). In Step 10010, the resonator (402) generates a plurality of vibrations based on the ultrasonic pressure waves. In Step 10020, a voltage across the top gate electrode (211) and bottom gate electrode (201) is generated by the piezoelectric layer (402) based on the plurality of vibrations. In Step 10030, a current in the semiconductor layer (203) is modulated based on the generated voltage across the top gate electrode (211) and bottom gate electrode (201). In one or more embodiments, the steps in FIG. 10 are executed after the steps in FIG. 9. In one or more embodiments of the invention, the steps in FIG. 10 are executed before the steps in FIG. 9.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An ultrasonic transceiver, comprising:
 a piezoelectric integrated thin film transistor (PITFT), comprising:
  a top gate electrode and a bottom gate electrode;
  a piezoelectric layer that:
   generates, during a transmitter mode, a first plurality of vibrations in response to a first voltage applied across the top gate electrode and the bottom gate electrode; and
   generates, during a receiver mode, a second voltage across the top gate electrode and the bottom gate electrode in response to a second plurality of vibrations;
  a semiconductor layer located between the top gate electrode and the bottom gate electrode that modules a current in the semiconductor layer in response to a voltage across the top gate electrode and bottom gate electrode; and
  a source electrode and a drain electrode connected to the semiconductor layer; and
 micro-electrical-mechanical systems (MEMS) mechanically coupled to the PITFT, comprising a resonator that:
  transmits, during the transmitter mode, a first plurality of ultrasonic pressure waves based on the first plurality of vibrations generated by the piezoelectric layer; and
  receives, during the receiver mode, a second plurality of ultrasonic pressure waves and generate the second plurality of vibrations based on the second plurality of ultrasonic pressure waves.

2. The ultrasonic transceiver of claim 1, wherein the resonator is a cavity created by an etching process and the lower gate is a backstop to the etching process.

3. The ultrasonic transceiver of claim 2, wherein the cavity is disposed in a hard substrate.

4. The ultrasonic transceiver of claim 3, wherein the hard substrate is one selected from the group comprising glass, silicon, and ceramic.

5. The ultrasonic transceiver of claim 2, wherein the cavity is disposed in a soft substrate.

6. The ultrasonic transceiver of claim 5, wherein the soft substrate is one selected from the group comprising polyimide and Teflon.

7. The ultrasonic transmitter of claim 1, wherein the piezoelectric layer has a thickness between 100 nm and 2000 nm.

8. The ultrasonic transmitter of claim 1, wherein the source electrode has a thickness between 50 nm and 500 nm.

9. The ultrasonic transmitter of claim 1, wherein the drain electrode has a thickness between 50 nm and 500 nm.

10. The ultrasonic transmitter of claim 1, wherein the top gate electrode has a thickness between 50 nm and 500 nm.

11. The ultrasonic transmitter of claim 1, wherein the drain electrode has a thickness between 50 nm and 500 nm.

12. The ultrasonic transmitter of claim 1, wherein the semiconductor layer is one selected from the group comprising silicon, silicon-germanium alloys, and III-V compound semiconductors.

\* \* \* \* \*